United States Patent [19]

Miki

[11] Patent Number: 5,625,319

[45] Date of Patent: Apr. 29, 1997

[54] FM DEMODULATOR FOR RECEPTION OF SATELLITE BROADCASTING

[75] Inventor: Kazuya Miki, Hyogo, Japan

[73] Assignee: Sharp Kabushiki Kaisha, Osaka, Japan

[21] Appl. No.: 550,677

[22] Filed: Oct. 31, 1995

[30] Foreign Application Priority Data

Oct. 31, 1994 [JP] Japan .................................. 6-266857
May 31, 1995 [JP] Japan .................................. 7-133829

[51] Int. Cl.⁶ .............................. H03D 3/00; H03L 7/093
[52] U.S. Cl. ........................... 329/325; 329/326; 331/10; 331/17; 331/23; 455/208; 455/214; 455/337
[58] Field of Search ..................... 329/325, 326; 331/10, 17, 23; 327/156; 455/208, 209, 214, 260, 337

[56] References Cited

U.S. PATENT DOCUMENTS 4,031,483  6/1977  Formeister ..................... 329/325 X

FOREIGN PATENT DOCUMENTS 63-39291   2/1988   Japan .
2-120914  10/1990   Japan .

*Primary Examiner*—David Mis

[57] ABSTRACT

An FM demodulator demodulating an FM modulated input signal through a PLL circuit, which includes a phase comparator a loop filter, a DC amplifier, a BB amplifier, and a VCO, and outputting the demodulated signal further includes a feedback circuit connected in parallel to DC amplifier and having a resistance which is a function of an external control voltage. The feedback circuit may be connected in parallel to both DC amplifier and BB amplifier. A PIN diode is typically used as a resistance variable element in the feedback circuit.

6 Claims, 9 Drawing Sheets

CN VS SN : Vo = 0(V)

FM DEMODULATOR FOR RECEPTION OF SATELLITE BROADCASTING

BACKGROUND OF THE INVENTION

1. Field of the Invention

The present invention relates to FM (Frequency Modulation) demodulators for FM demodulating the FM modulated signals, and more particularly, to an FM demodulator for use in a satellite broadcasting receiver.

2. Description of the Background Art

Many satellite broadcasting receivers utilize an FM demodulator with a PLL (Phase Locked Loop) in order to reduce threshold noise.

FIG. 8 is a block circuit diagram of a conventional FM demodulator. As shown in FIG. 8, an FM modulated signal is input to an input terminal $T_{in}$ and transmitted through a phase comparator 20, a loop filter 21, a DC (Direct Current) amplifier 22, and a BB (Base Band) amplifier 23, and a demodulated output signal is obtained from an output terminal $T_{out}$. The output of DC amplifier 22 is fed back to phase comparator 20 through a VCO (Voltage-Controlled Oscillator).

In the circuit above, phase comparator 20 detects a phase difference between the input FM signal and the output of VCO 24. Loop filter 21 attenuates the noise component of the input signal which falls out of the band. DC amplifier 22 amplifies the output of loop filter 21 and outputs the amplified signal to BB amplifier 23 as a demodulated signal. The output of DC amplifier 22 is also fed back to VCO 24 and controls an oscillation frequency thereof.

In a satellite broadcasting receiver, a signal level which is input to the receiver may decline and a CN ratio (Carrier to Noise Ratio) may deteriorate in wet weather, for example, leading to a higher noise level relative to the signal in the FM demodulator. When the noise level exceeds a certain point, impulse noise might be generated sharply to degrade an SN ratio (Signal to Noise Ratio), whereby threshold noise might be generated in a TV screen. Such a symptom is characteristic of FM demodulator.

More specifically, although it is true that FM demodulators have an advantage of improving the SN ratio when the CN ratio is good, they also have a drawback that, when the CN ratio hits a certain point (hereinafter referred to as a threshold level) or lower, noise is sharply increased in the signal in the FM demodulator and the SN ratio is degraded. Generally, the CN ratio and the SN ratio are measured at $T_{in}$ and $T_{out}$, respectively, in FIG. 8.

FIG. 9 shows the characteristics of degradation in the SN ratio of the conventional FM demodulator as described above. The horizontal axis shows the CN ratio and the vertical axis shows the SN ratio. In the figure, a line A shows an ideal characteristic line of the CN ratio versus the SN ratio, and a line B shows a characteristic line of the conventional FM demodulator. A line C is a line used for obtaining a static threshold value of the conventional FM demodulator, in parallel to and lower than line A by 1 dB. The CN ratio at a crossing point P1 of lines B and C is called a static threshold value.

It can be seen from FIG. 9 that a region of the CN ratio where the SN ratio deteriorates becomes lower as the static threshold value as defined above decreases: in other words, the characteristic line becomes closer to line A showing better signal reception characteristics. The static threshold value of the FM demodulator shown in FIG. 9 is the value of the CN ratio at crossing point P1 in the figure, i.e., 5.8 dB.

As can be seen from line B in FIG. 9, the conventional FM demodulator shows nearly ideal characteristics when the CN ratio is approximately 10 dB or higher. However, the SN ratio deteriorates when the CN ratio is approximately 8 dB or lower. Especially, the characteristics of the FM demodulator sharply worsens when the CN ratio is approximately 6 dB or lower.

This gives rise to the following problems. Specifically, although the conventional FM demodulator receives signals almost ideally when the CN ratio is high, that is, in a region or in signal receiving conditions where FM signals reach sufficiently, the reception signal deteriorates and image quality is degraded sharply in a region or in signal receiving conditions where the CN ratio is low, that is, where FM signals do not reach sufficiently.

SUMMARY OF THE INVENTION

Therefore, an object of the present invention is to provide a highly reliable FM demodulator which can suppress deterioration of the SN ratio even when the CN ratio is low, so as to obtain a high image quality.

The FM demodulator in accordance with the present invention includes: a voltage-controlled oscillator for outputting a signal whose frequency is a function of a control input; a phase comparator for comparing an FM modulated input signal with an output signal of the voltage-controlled oscillator and outputting a phase comparison signal which represents the phase difference therebetween; a loop filter for attenuating noise which falls out of a predetermined band from an output of the phase comparator; a DC amplifier for amplifying an output of the loop filter and applying the amplified signal to the voltage-controlled oscillator as the control input; a BB amplifier connected to the output of the DC amplifier for demodulating an input signal from the output of the DC amplifier; and a feedback circuit whose resistance is a function of an external control voltage for feeding back the output of the DC amplifier to the input of the DC amplifier.

The feedback circuit may include a variable resistance circuit connected to the input and the output of the DC amplifier in parallel thereto and having a resistance which is a function of the external control voltage.

The variable resistance circuit may include: a first capacitance element having one terminal connected to the input of the DC amplifier; a PIN diode having an anode connected to the other terminal of the first capacitance element; a first resistor having one terminal connected to a cathode of the PIN diode; a second resistor connected in series between the other terminal of the first resistor and a ground potential; a second capacitance element having one terminal connected to the output of the DC amplifier and the other terminal connected to a connection point between the first and second resistors; and a third resistor having one terminal connected to a connection point between the first capacitance element and the anode of the PIN diode and the other terminal connected to the control voltage.

According to another aspect of the present invention, an FM demodulator includes: a voltage-controlled oscillator for outputting a signal whose frequency is a function of a control input; a phase comparator for comparing an FM modulated input signal with the output signal of the voltage-controlled oscillator and outputting a phase comparison signal which represents the phase difference therebetween; a loop filter for attenuating noise which falls out of a predetermined band from the output of the phase comparator; a DC amplifier for amplifying an output of the loop filter and applying the amplified signal to the voltage-controlled oscillator as the control input; a BB amplifier connected to an output of the DC amplifier and demodulating an input signal from the output of the DC amplifier; and a feedback circuit whose resistance is a function of an external control voltage for feeding back an output of the BB amplifier to the input of the DC amplifier.

The feedback circuit may include a variable resistance circuit connected to the input of the DC amplifier and the output of the BB amplifier in parallel to these two amplifiers and having a resistance which is a function of the external control voltage.

The variable resistance circuit may include: a first capacitance element having One terminal connected to the input of the DC amplifier; a PIN diode having an anode connected to the other terminal of the first capacitance element; a first resistor having one terminal connected to a cathode of the PIN diode; a second resistor connected in series between the other terminal of the first resistor and a ground potential; a second capacitance element having one terminal connected to the output of the BB amplifier and the other terminal connected to a connection point between the first and second resistors; and a third resistor having one terminal connected to a connection point between the first capacitance element and the anode of the PIN diode and the other terminal connected to a control voltage.

Generally, in the FM demodulator having the PLL circuit consisting of phase comparator 20, loop filter 21, DC amplifier 22, BB amplifier 23, and VCO 24 as shown in FIG. 8, a loop gain K of a whole FM demodulator can be expressed by the following equation (1).

$$K = K\psi \cdot Kv \cdot Kd \quad (1)$$

where $K\psi$ is a gain of phase comparator 20, Kv is a gain of VCO 24, and Kd is a gain Of DC amplifier 22. BB amplifier 23 is provided for amplifying the gain of Kd.

It is assumed that loop filter 21 is a lag lead filter as shown in FIG. 10 and that time constants $T_1$ and $T_2$ of the lag lead filter circuit are expressed by the following equations (2).

$$T_1 = R1 \cdot C$$

$$T_2 = R2 \cdot C \quad (2)$$

The natural frequency $\omega n$ of the loop is expressed by the following equation (3).

$$\omega n = \{K/(T_1+T_2)\}^{1/2} \quad (3)$$

Natural frequency $\omega n$ is an important factor which determines the characteristics of an FM demodulator, and threshold noise can be reduced by making the value of the natural frequency smaller.

Since resistors R1 and R2 and a capacitor C are fixed, $T_1$ and $T_2$ are fixed values as can be seen from the equations (2). The value of $\omega n$ can be adjusted by adjustment of the value K. Since the value of K is obtained from the equation (1), natural frequency $\omega n$ can also be adjusted by adjustment of gain Kd of the DC amplifier.

When the CN ratio of an input signal deteriorates, loop gain K can be made smaller by reducing gain Kd of the DC amplifier by means of the external control voltage. As a result, natural frequency $\omega n$ is also reduced, and the high frequency component including a great amount of noise component can be eliminated. Consequently, threshold noise can be reduced and the SN ratio can be improved. For this purpose, according to the present invention, a feedback circuit having a resistance which is a function of the external control voltage is provided in parallel to the DC amplifier.

In a preferred embodiment which will be described later, a PIN diode is provided as a feedback circuit in parallel to the DC amplifier so as to adjust gain Kd. The PIN diode has the characteristics that its forward resistance component is a function of the value of its current. For example, their resistance of the PIN diode is reduced as the value of the current increases. More specifically, in the circuit thus structured, the resistance of the PIN diode can be reduced and gain Kd of the DC amplifier and natural frequency $\omega n$ can also be reduced by increasing the value of the current applied to a voltage input terminal Vin. Eventually, threshold noise can be reduced and the SN ratio can be improved.

As in another embodiment, by connecting the PIN diode in parallel to both BB amplifier and DC amplifier rather than to the DC amplifier alone, the amount of change in the gain of Kd can be made greater by the amount of gain of the BB amplifier, thereby further improving the SN ratio.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A feature of the present invention lies in the fact that the gain of the DC amplifier constituting a part of the PLL circuit is made variable by connecting a resistance variable portion serving as a feedback circuit in parallel to the DC amplifier. By adjusting the gain of the DC amplifier, the natural frequency of the loop in the FM demodulator can be adjusted and thus the SN ratio characteristics can be improved. By connecting one end of the feedback path formed by the resistance variable portion to an output of the BB amplifier in a succeeding stage rather than to an output of the DC amplifier, a greater amount of change in the gain of the amplifier can be obtained, thereby improving the SN ratio even more efficiently.

Now, a first embodiment of the present invention will be described in detail with reference to FIG. 1–FIG. 4.

Figure 1:
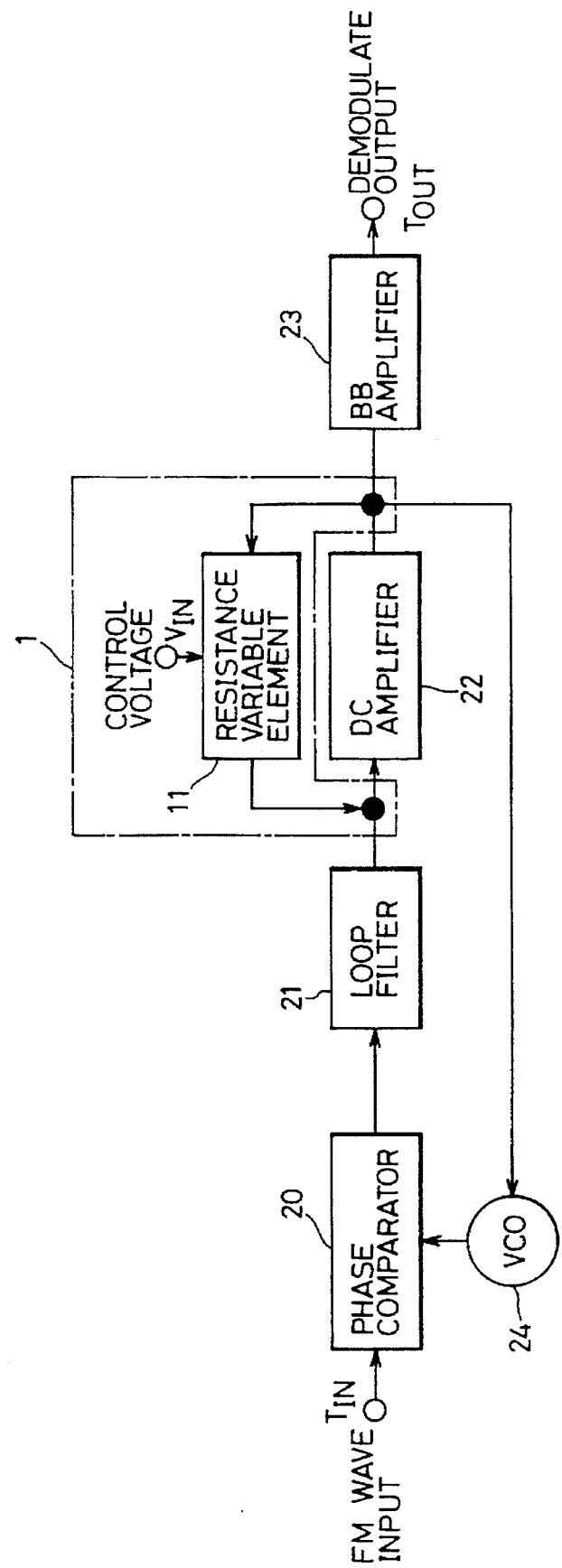
FIG. 1 is a block circuit diagram of an FM demodulator in accordance with a first embodiment of the present invention.
Figure 8:
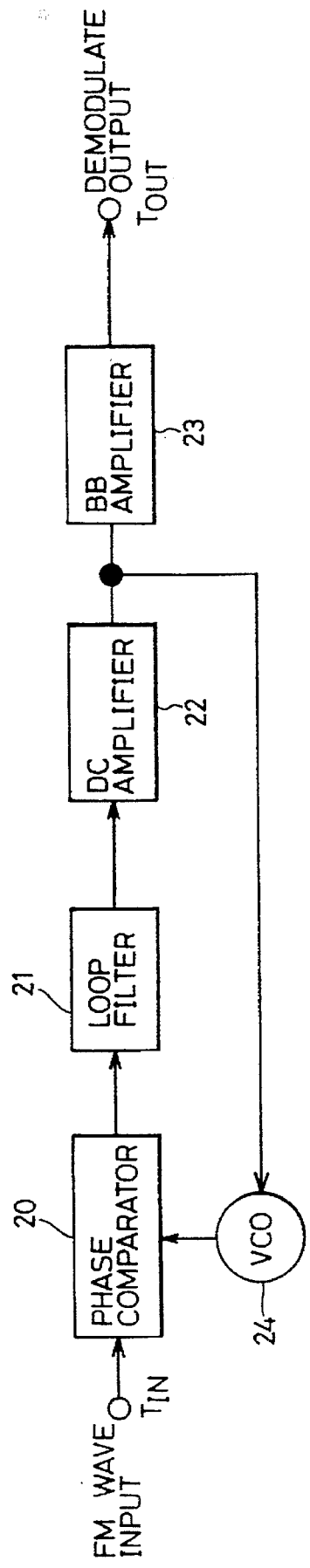
FIG. 8 is a block circuit diagram of a conventional FM demodulator.

An FM demodulator shown in FIG. 1 is the same as the conventional FM demodulator shown in FIG. 8 except a bias circuit for the DC amplifier. In FIG. 1, the portions having the same function as those in FIG. 8 are labeled with the same characters. As shown in FIG. 1, an FM demodulated signal is input to input terminal $T_{in}$ and transmitted through phase comparator 20, loop filter 21, DC amplifier 22, and BB amplifier 23, and the demodulated output signal is obtained from output terminal $T_{out}$. The output of DC amplifier 22 is fed back to phase comparator 20 through VCO 24. The PLL circuit is thus formed. The FM demodulator in accordance with the present invention further includes a resistance variable circuit 1 connected to both ends of DC amplifier 22 in parallel thereto and serving as a feedback circuit. Resistance variable circuit 1 is provided with a voltage input terminal $V_{in}$ for receiving an external control voltage for changing a resistance thereof.

Figure 2:
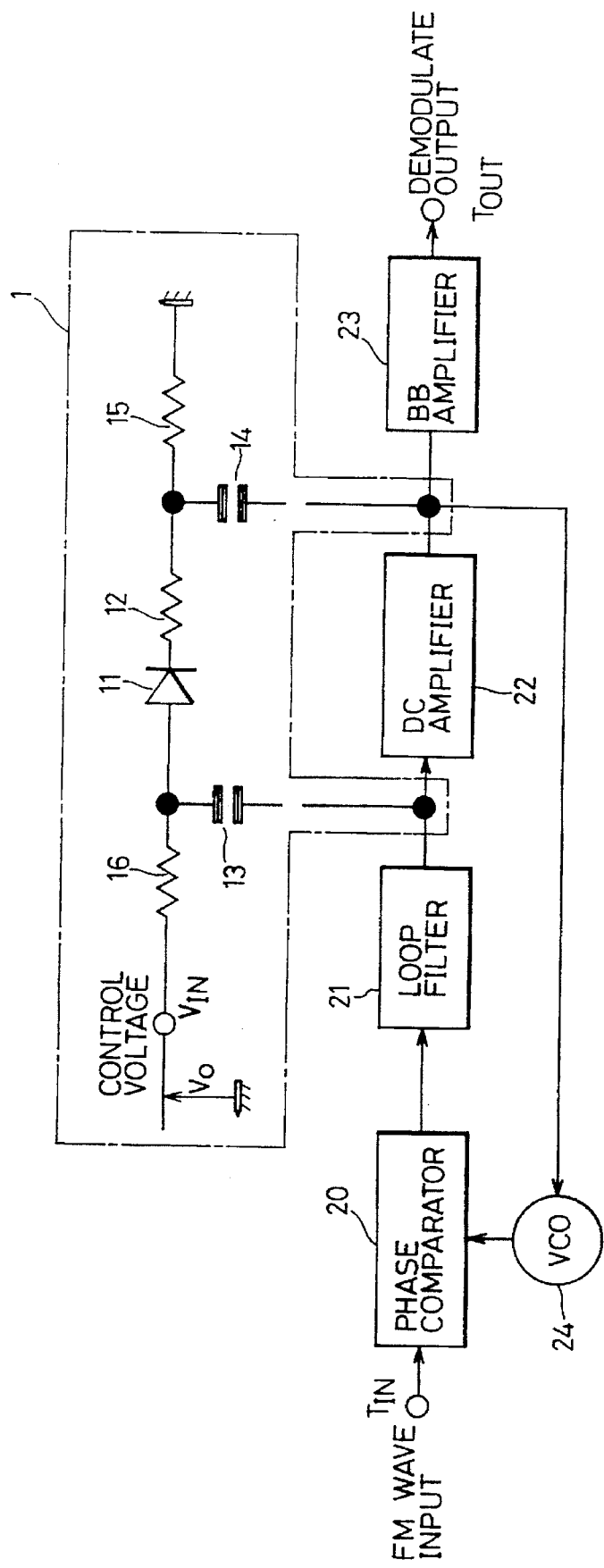
FIG. 2 is a circuit diagram of the FM demodulator in accordance with the first embodiment of the present invention.

The above-mentioned resistance variable circuit 1 includes, as shown in FIG. 2, a PIN diode 11 serving as a resistance variable element and a corrective resistor 12 connected in series and capacitors 13 and 14 for connecting them to both ends of DC amplifier 22 in parallel thereto and serving as capacitance elements, thereby forming a feedback circuit. The connection point between corrective resistor 12 and capacitor 14 is connected to the ground through a resistor 15. The connection point between an anode of PIN diode 11 and capacitor 13 is connected to input terminal $V_{in}$ of control voltage $V_0$ through a resistor 16.

PIN diode 11 is connected in parallel to DC amplifier 22 in order to utilize the characteristics of the PIN diode, that is, the characteristics that the forward resistance component of the PIN diode is a function of the value of its current (the resistance is several $\Omega$ when a current is 10 mA, and the resistance is several $K\Omega$ when no current flows). The resistance of the PIN diode is reduced as the value of the current increase. In other words, in the circuit of the first embodiment, the resistance of PIN diode 11 is reduced as voltage value $V_0$ applied to voltage input terminal $V_{in}$ is increased. By increasing voltage $V_0$ applied to voltage input terminal $V_{in}$, the resistance of PIN diode 11 can be reduced, thereby lowering the gain of DC amplifier 22. By adjusting of the gain of DC amplifier 22, the loop gain of the FM demodulator can also be adjusted, so that improvement in threshold noise can be achieved eventually, because of the following reasons.

It is assumed that $K\psi$ indicates the gain of phase comparator 20, Kv indicates the gain of VCO 24, and Kd indicates the gain of DC amplifier 22 in a circuit structure without gain adjustment function as in the present embodiment. Loop gain K of a whole FM demodulator can be generally expressed by the following equation (4).

$$K=K\psi \cdot Kv \cdot Kd \qquad (4)$$

Figure 10:
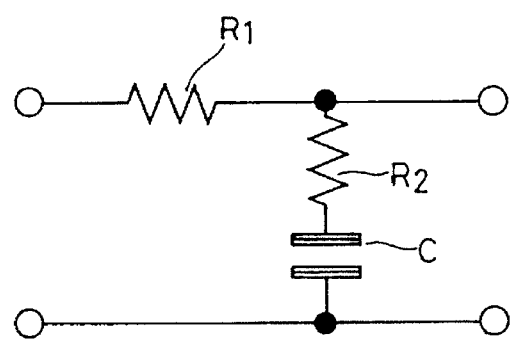
FIG. 10 is a circuit diagram of a loop filter for use in the FM demodulator.

A lag lead filter with the circuit structure as shown in FIG. 10, for example, is used as loop filter 21. It is assumed that the lag lead filter includes resistors Ri and R2 and capacitor C. It is also assumed that time constants $T_1$ and $T_2$ can be expressed by the following equations (5).

$$T_1=R1 \cdot C$$

$$T_2=R2 \cdot C \qquad (5)$$

Natural frequency $\omega n$ of the loop is represented by the following equation (6).

$$\omega n=\{K/(T_1+T_2)\}^{1/2} \qquad (6)$$

Natural frequency $\omega n$ is an important factor which determines the characteristics of an FM demodulator, and threshold noise can be reduced by making the natural frequency smaller.

In the equation (6), since resistors R1 and R2 and capacitor C are fixed, time constants $T_1$ and $T_2$ have respective fixed values as can be seen from the equation (5). Adjustment of $\omega n$ can be achieved by adjusting the value of K. Since the value of K is obtained by the equation (4), adjustment of natural frequency $\omega n$ can be achieved by adjusting gain Kd of the DC amplifier.

More specifically, if the CN ratio of an input signal is degraded, loop gain K can be decreased by reducing gain Kd of the DC amplifier by means of the external control voltage, so that natural frequency $\omega n$ is also decreased. As a result, the high frequency component with a great amount of noise component can be eliminated from the input signal, whereby threshold noise can be reduced and the SN ratio can be improved. Examples of the components selected for forming of the resistance variable circuit are as follows.

Resistor R12; 100 $\Omega$

Capacitor C13 and C14; 0.1 $\mu F$

Resistor R15; 1 $K\Omega$

Next, description will be made of improvement in the SN ratio by using the FM demodulator of the present invention with reference to FIG. 3.

Figure 3:
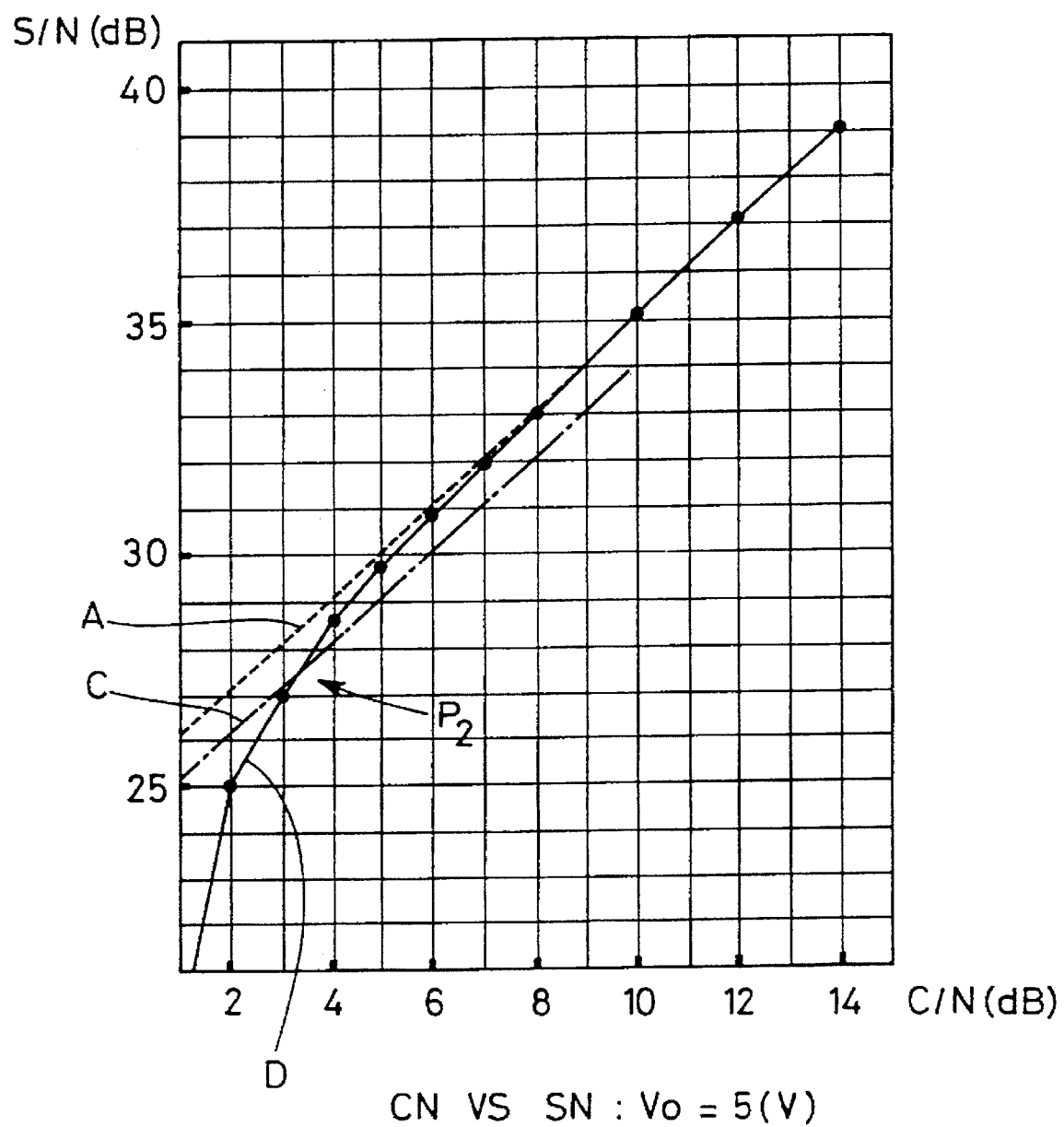
FIG. 3 shows the characteristics of the CN ratio versus SN ratio of the FM demodulator shown in FIG. 2.
Figure 9:
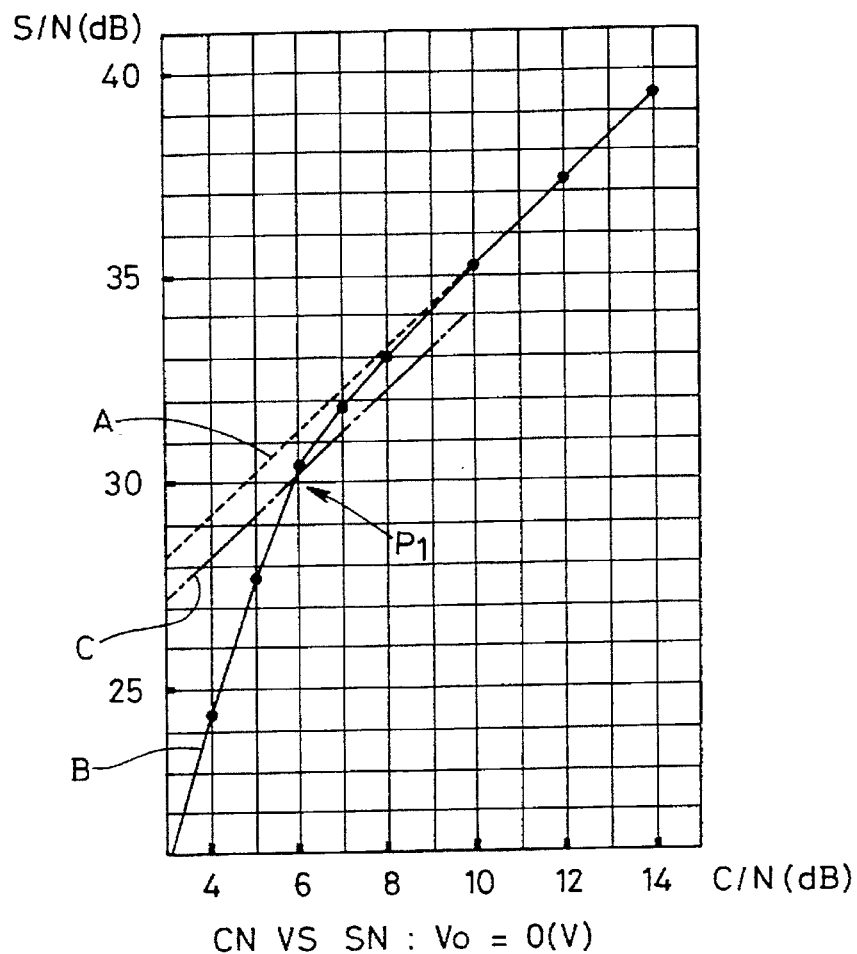
FIG. 9 shows the characteristics of the CN ratio versus SN ratio of the conventional FM demodulator.

The characteristics shown in FIG. 3 corresponds with those in FIG. 9, showing improvement in the characteristics of the FM demodulator. In FIG. 3, the horizontal axis shows the CN ratio, and the vertical axis shows the SN ratio. In the figure, line A is the ideal characteristic line of the CN ratio versus SN ratio. Line C is the line used for obtaining a static threshold value of the FM demodulator, being in parallel to and lower than line A by 1 dB, as described above. Line D shows the characteristics obtained by the FM demodulator in accordance with the present embodiment.

In the example shown in FIG. 3, voltage $V_0$ applied to control voltage terminal $V_{in}$, FIG. 1 (or FIG. 2) is set as 5 V. In the present embodiment, the characteristics close to line A showing the ideal characteristic line is obtained even in a region where the CN ratio is low, as can be seen from line D in FIG. 3. The static threshold value, that is the value of CN ratio at a crossing point P2 of lines C and D is 3.2 dB, showing an improvement over the value of 5.8 dB of the conventional FM demodulator shown in FIG. 9. In other words, in the FM demodulator of the present embodiment, the static threshold value is improved by 2.6 dB (=5.8 dB–3.2 dB) over the conventional FM demodulator.

Figure 4:
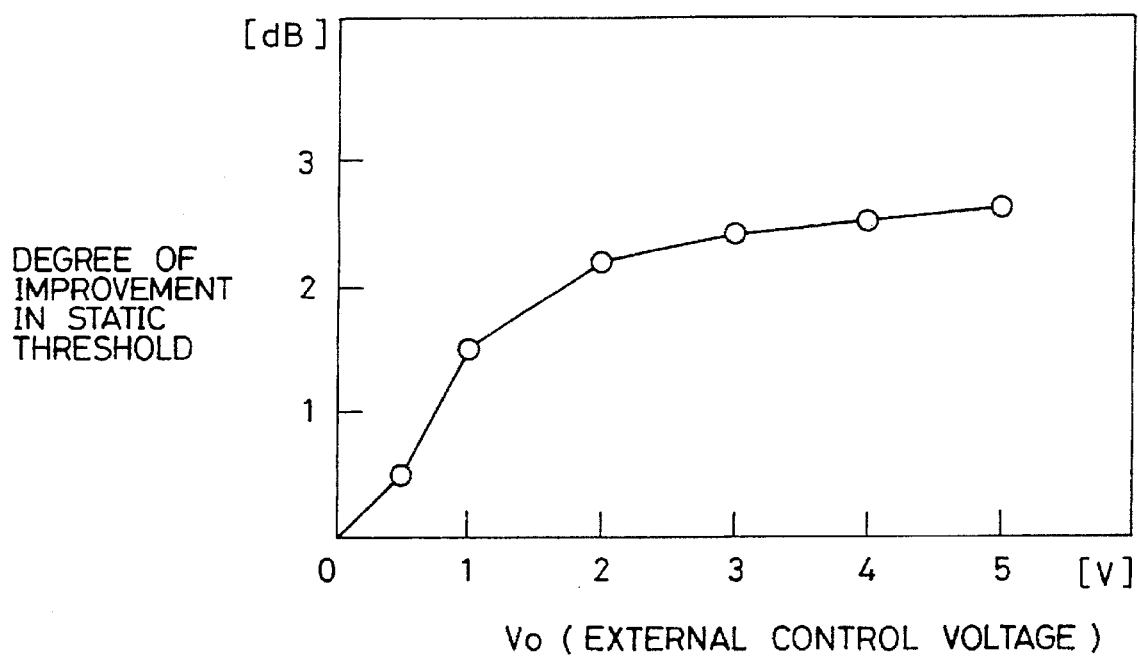
FIG. 4 shows the characteristics of the external control voltage versus SN ratio of the FM demodulator shown in FIG. 2.

FIG. 4 shows the degree of improvement. In FIG. 4, the horizontal axis shows external control voltage $V_0$ applied to control voltage terminal $V_{in}$, and the vertical axis shows the degree of improvement, that is, how much improvement is achieved in terms of the SN ratio over the conventional example. Compared with the example shown in FIG. 3, the degree of improvement corresponding to the external control voltage of 5 V in FIG. 4 is 2.6 dB, consistent with the data (2.6 dB) shown in FIG. 3.

As can be seen from FIG. 4, the degree of improvement can be further enhanced if the voltage of approximately 2 V or higher is applied to control voltage terminal $V_{in}$.

Although the voltage in the range of 0–5 V is applied here to control voltage $V_{in}$, it may exceed 5 V as needed.

It should be noted that the external control voltage is applied as described above only when the CN ratio of the input signal is degraded. If the high frequency component is eliminated from the input signal when the CN ratio is satisfactory, the signal component around the maximum frequency deviation is lost, causing generation of truncation noise and deterioration in the image quality, as will be described later. Therefore, it is desirable to apply the external control voltage only in a region where the CN ratio is low or when the CN ratio is decreased.

Many methods can be conceived for sensing deterioration in the CN ratio and applying the external control voltage to control voltage terminal $V_{in}$. As an example, a viewer of the TV screen can control the external control voltage with a remote controller in accordance with the image quality. In another example, the CN ratio can be sensed at signal input terminal $T_{in}$, and the external control voltage applied to control voltage terminal $V_{in}$ can be controlled automatically in response to a drop in the CN ratio.

It should be especially noted that setting the external control voltage to a maximum (5 V in the present embodiment) when the CN ratio is low is not always desirable. The reasons will be described below.

In addition to threshold noise, image quality is influenced also by noise called truncation noise, and these two kinds of noise are generated simultaneously. They have a characteristic of being reciprocal to each other; when one noise is great in amount, the other noise tends to be small. Therefore, a problem will be caused that truncation noise is increased even if a reduction in threshold noise can be achieved. Nevertheless, a greater emphasis should be placed on reduction in threshold noise. This is because threshold noise gives more prominent effects on the image quality than truncation noise if the image is a motion picture. In satellite broadcasting, the TV screen usually displays a motion picture. Therefore, it is preferable to seek reduction in threshold noise even though it causes some increase in truncation noise.

However, if truncation noise is extremely increased, some adjustment would be required. It is for the purpose of achieving such adjustments that the gain of the DC amplifier is made adjustable by the external control voltage in the present invention.

Figure 5:
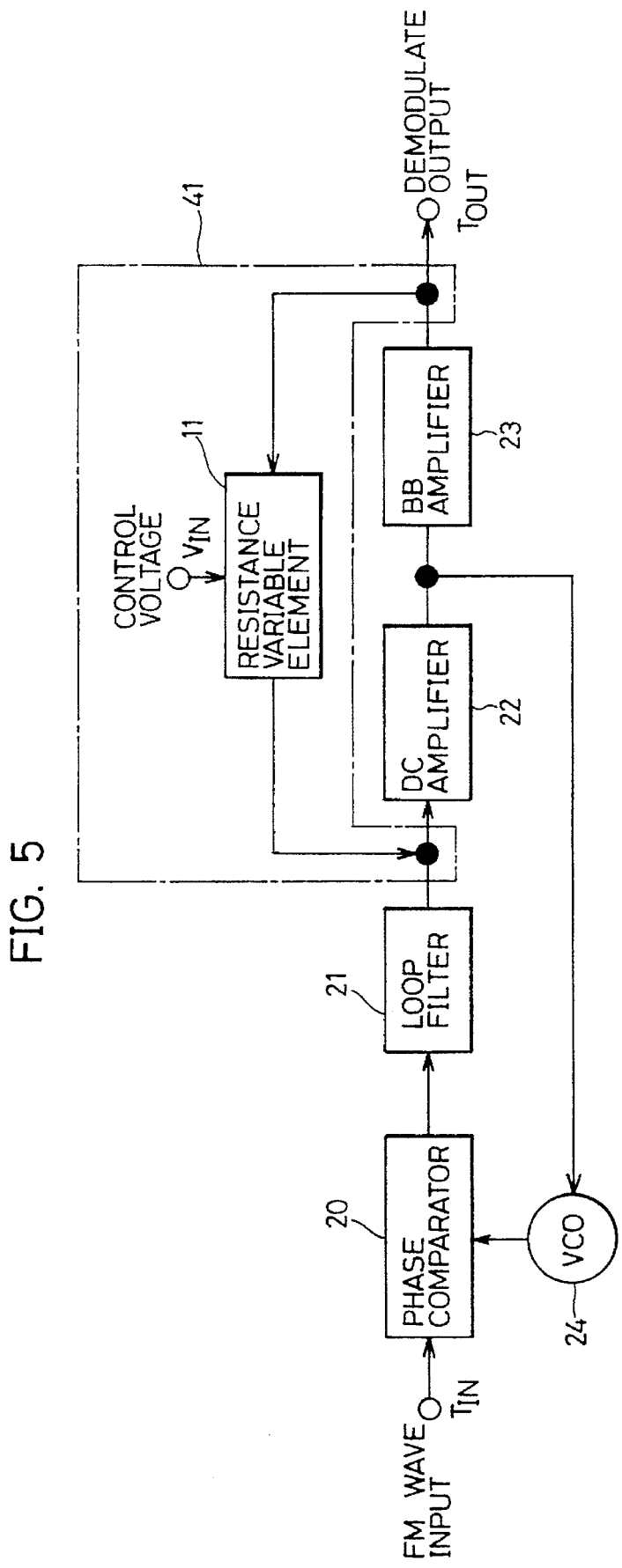
FIG. 5 is a block circuit diagram of an FM demodulator in accordance with a second embodiment of the present invention.
Figure 6:
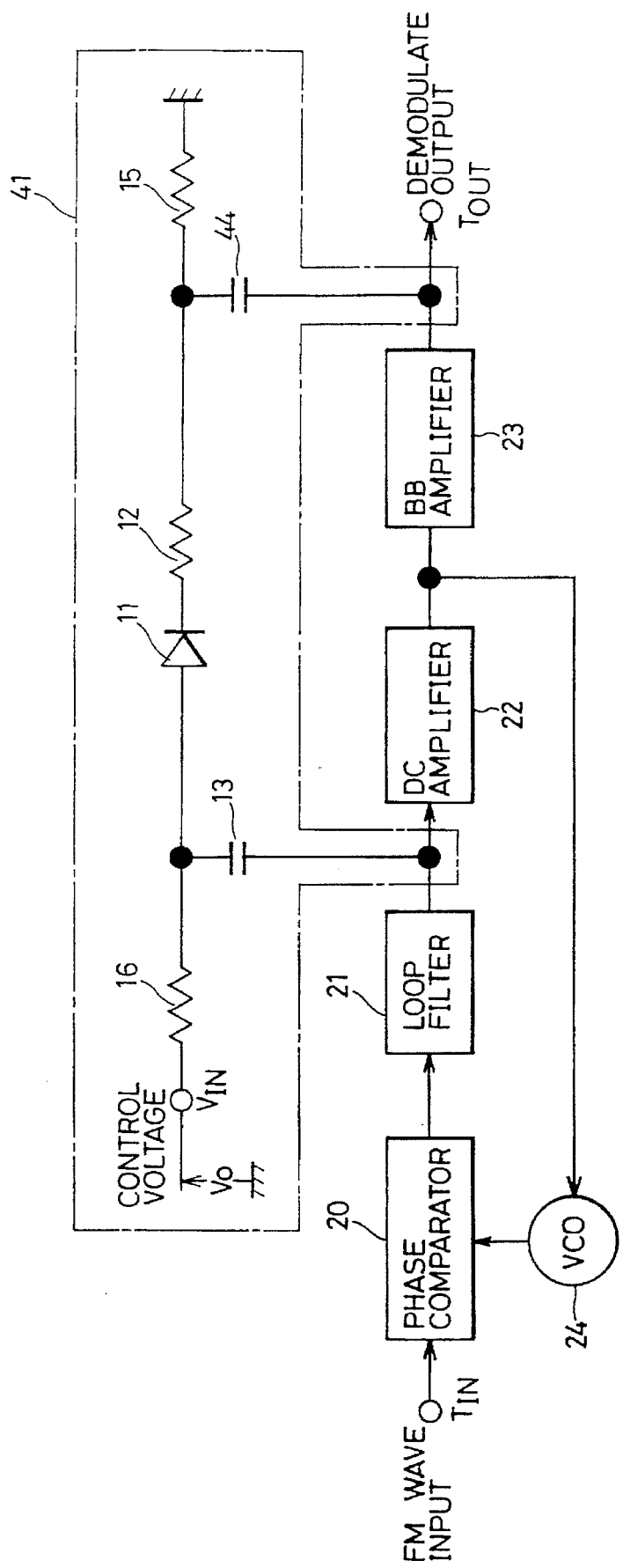
FIG. 6 is a circuit diagram of the FM demodulator in accordance with the second embodiment of the present invention.

FIGS. 5 and 6 are a block circuit diagram and a specific circuit diagram, respectively, of an FM demodulator in accordance with a second embodiment of the present invention. The FM demodulator of the second embodiment is the same as that in the first embodiment shown in FIGS. 1 and 2, except for the resistance variable circuit. In order to clarify a feature of the present embodiment, the description of the second embodiment will be made only in terms of the difference between the two embodiments.

A feature of the FM demodulator of the second embodiment lies in that the resistance variable circuit 1 shown in FIG. 1 is replaced by a resistance variable circuit 41 serving as a feedback circuit which is provided in parallel not only to DC amplifier 22 but to both DC amplifier 22 and BB amplifier 23. More specifically, referring to FIG. 6, capacitor 14 in FIG. 2 is replaced by a capacitor 44 having one electrode connected to a connection point between resistors 12 and 15 and the other electrode connected to the output of BB amplifier 23.

By thus feeding back the output of BB amplifier 23 to the input of DC amplifier 22, a wider range of the change in gain Kd is obtained as compared with the case where a resistance variable circuit is provided to be connected only to DC amplifier 22. Consequently, loop gain K can be reduced even further, leading to a greater improvement in the SN ratio than with the FM demodulator of the first embodiment.

Figure 7:
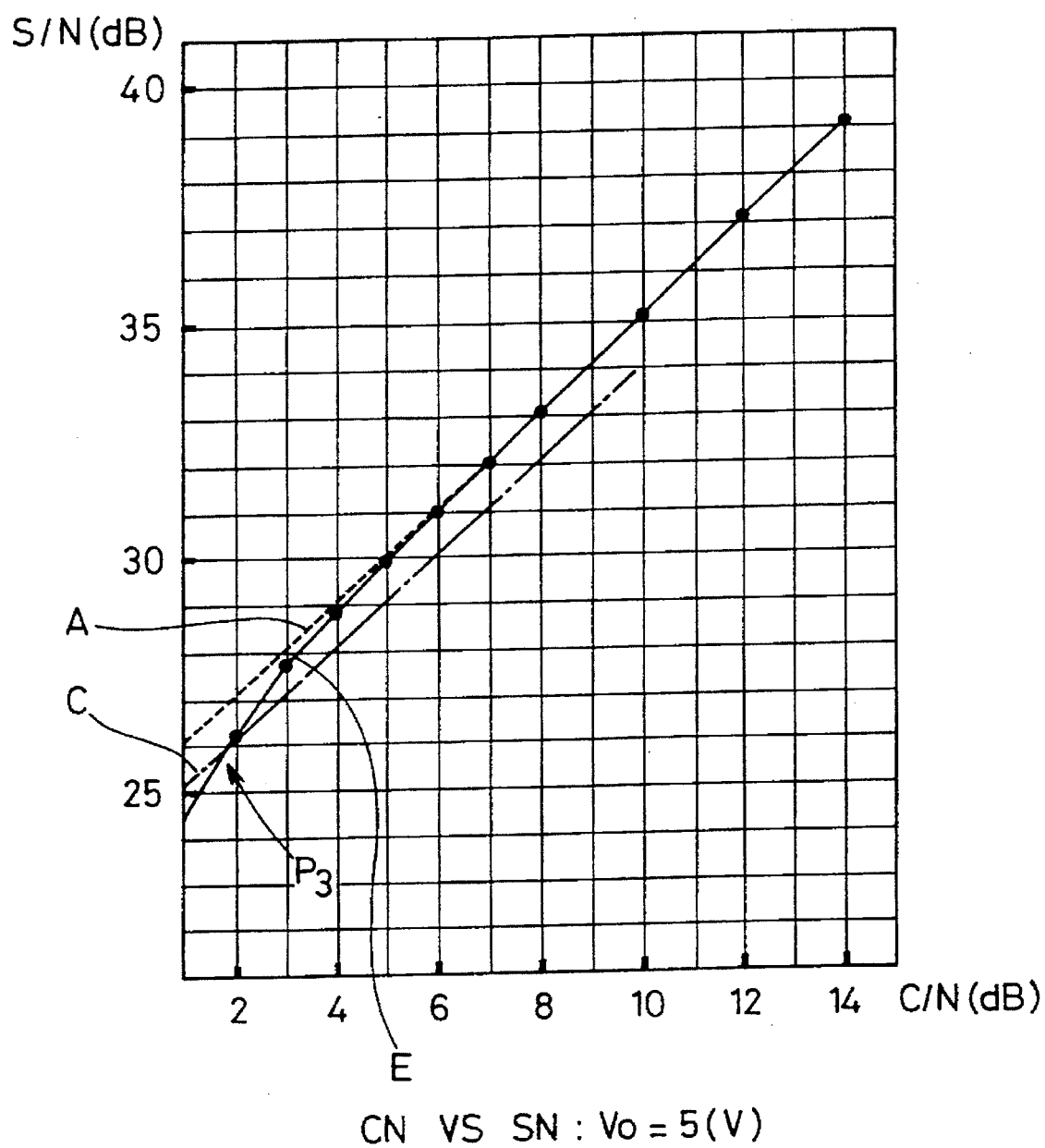
FIG. 7 shows the characteristics of the CN ratio versus SN ratio of the FM demodulator in accordance with the second embodiment of the present invention.

FIG. 7 shows that a greater improvement in the SN ratio can be achieved by the second embodiment. FIG. 7 corresponds to FIG. 3, showing a greater improvement in terms of the characteristics of the FM demodulator. The static threshold value of this case, i.e. the value of the CN ratio at a crossing point P3 of lines C and E is 1.8 dB, showing a further improvement over the first embodiment shown in FIG. 1 in which the CN ratio is 3.2 dB. Compared with the conventional example shown in FIG. 9, it can be said that the static threshold value can be improved as much as 4.0 dB (=5.8 dB–1.8 dB).

As described above, in accordance with the present invention, only by an addition of a relatively simple circuit to a conventional FM demodulator, the gain of the DC amplifier in the FM demodulator and therefore the natural frequency of the loop thereof can be adjusted as desired and the image quality with a good SN ratio can be obtained.

Particularly, threshold noise can be easily reduced and the SN ratio can be improved even in a region or in a condition where the CN ratio of the input signal is low, without causing excessive truncation noise.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An FM demodulator, comprising:

a voltage-controlled oscillator for outputting a signal whose frequency is a function of a control input;

a phase comparator for comparing an FM modulated input signal with an output signal of said voltage-controlled oscillator and outputting a phase comparison signal representing a phase difference therebetween;

a loop filter for attenuating noise which falls out of a predetermined band from an output of said phase comparator;

a DC amplifier for amplifying an output of the loop filter and applying the amplified signal to the voltage-controlled oscillator as the control input;

a BB amplifier connected to an output of said DC amplifier and demodulating an input signal from the output of said DC amplifier; and a feedback circuit whose resistance is a function of an external control voltage for feeding back the output of said DC amplifier to an input of said DC amplifier.

2. The FM demodulator according to claim 1, wherein said feed back circuit includes;

a variable resistance circuit connected to the input and the output of said DC amplifier in parallel to said DC amplifier and having a resistance which is a function of said external control voltage.

3. The FM demodulator according to claim 2, wherein the variable resistance circuit includes;

a first capacitance element having one terminal connected to the input of said DC amplifier, a PIN diode having an anode connected to the other terminal of said first capacitance element a first resistor having one terminal connected to a cathode of said PIN diode, a second resistor serially connected between the other terminal of said first resistor and a ground potential, a second capacitance element having one terminal connected to the output of said DC amplifier, and the other terminal connected to a connection point between said first resistor and said second resistor, and a third resistor having one terminal connected to a connection point between said first capacitance element and the anode of said PIN diode, and the other terminal connected to said control voltage.

4. An FM demodulator, comprising:

a voltage-controlled oscillator for outputting a signal whose frequency is a function of a control input;

a phase comparator for comparing an FM modulated input signal with an output signal of said voltage-controlled oscillator and outputting a phase comparison signal representing a phase difference therebetween;

a loop filter for attenuating noise falling out of a predetermined band from an output of the phase comparator;

a DC amplifier for amplifying an output of the loop filter and applying the amplified signal to the voltage-controlled oscillator as the control input;

a BB amplifier connected to an output of said DC amplifier and demodulating an input signal from the output of said DC amplifier; and a feedback circuit whose resistance is a function of an external control voltage for feeding back an output of said BB amplifier to an input of said DC amplifier.

5. The FM demodulator according to claim 4, wherein the feedback circuit includes a resistance variable circuit connected in parallel to said DC amplifier and said BB amplifier with the input of said DC amplifier and with the output of said BB amplifier and having a resistance which is a function of said external control voltage.

6. The FM demodulator according to claim 5, wherein the variable resistance circuit includes, a first capacitance element having one terminal connected to the input of said DC amplifier, a PIN diode having an anode connected to the other terminal of said first capacitance element, a first resistor having one terminal connected to a cathode of said PIN diode, a second resistor connected in series between the other terminal of said first resistor and a ground potential, a second capacitance element having one terminal connected to the output of said BB amplifier, and the other terminal connected to a connection point between said first resistor and said second resistor, and a third resistor having one terminal connected to a connection point between said first capacitance element and the anode of said PIN diode, and the other terminal connected to said control voltage.

\* \* \* \* \*